United States Patent
Fischer et al.

(10) Patent No.: US 6,636,453 B2
(45) Date of Patent: Oct. 21, 2003

(54) MEMORY CIRCUIT HAVING A PLURALITY OF MEMORY AREAS

(75) Inventors: Helmut Fischer, Oberhaching (DE); Johann Pfeiffer, Ottobrunn (DE)

(73) Assignee: Infineon Technologies Ag, Munich (DE)

( * ) Notice: Subject to any disclaimer, the term of this patent is extended or adjusted under 35 U.S.C. 154(b) by 0 days.

(21) Appl. No.: 10/139,168

(22) Filed: May 6, 2002

(65) Prior Publication Data

US 2002/0163849 A1 Nov. 7, 2002

(30) Foreign Application Priority Data

May 4, 2001 (DE) .......................................... 101 21 837

(51) Int. Cl.$^7$ .............................................. G11C 11/00
(52) U.S. Cl. ...................... 365/230.03; 365/63; 365/51; 365/205; 365/202
(58) Field of Search ............................... 365/202, 205, 365/207, 51, 63, 230.03

(56) References Cited

U.S. PATENT DOCUMENTS

| | | | | |
|---|---|---|---|---|
| 5,546,349 A | * | 8/1996 | Watanabe et al. ....... | 365/230.04 |
| 5,740,123 A | * | 4/1998 | Uchida ..................... | 365/233 |
| 5,828,613 A | | 10/1998 | Hatakeyama et al. | |
| 5,909,388 A | * | 6/1999 | Mueller .................... | 365/63 |
| 5,917,744 A | * | 6/1999 | Kirihata et al. .......... | 365/63 |
| 5,966,315 A | * | 10/1999 | Muller et al. ............ | 365/51 |
| 6,140,805 A | * | 10/2000 | Kaneko et al. ........... | 323/280 |
| 6,452,824 B1 | * | 9/2002 | Okamura .................. | 365/51 |
| 2001/0015926 A1 | * | 8/2001 | Kato et al. ............... | 365/201 |

FOREIGN PATENT DOCUMENTS

| | | | | |
|---|---|---|---|---|
| EP | 0 469 862 A2 | 2/1992 | | |
| JP | 409120674 A | * 5/1997 | ......... | G11C/11/409 |
| JP | 410106269 A | * 4/1998 | ......... | G11C/11/413 |
| JP | 410326487 A | * 12/1998 | ......... | G11C/11/401 |
| JP | 411144464 A | * 5/1999 | ......... | G11C/11/409 |
| JP | 411330423 A | * 11/1999 | ......... | H01L/27/108 |
| JP | 2000149599 A | * 5/2000 | ........... | G11C/29/00 |

* cited by examiner

Primary Examiner—Viet Q. Nguyen
(74) Attorney, Agent, or Firm—Laurence A. Greenberg; Werner H. Stemer; Ralph E. Locher

(57) ABSTRACT

A memory circuit has at least two memory areas each including a group of primary read amplifiers. Each of these groups can be connected via an assigned local two-conductor data line to a two-conductor master data line whose conductors are connected to the input terminals of a secondary read amplifier. Before switching through a connection from a primary read amplifier to the secondary read amplifier, each of the conductors in both the relevant local data line and the master data line are equalized to a potential lying between two logic potentials. The supply potentials of the secondary read amplifier are provided so that the secondary read amplifier operates within the amplifying operating range when either of its input terminals is driven to the first logic potential and the other input terminal is driven to the second logic potential.

6 Claims, 3 Drawing Sheets

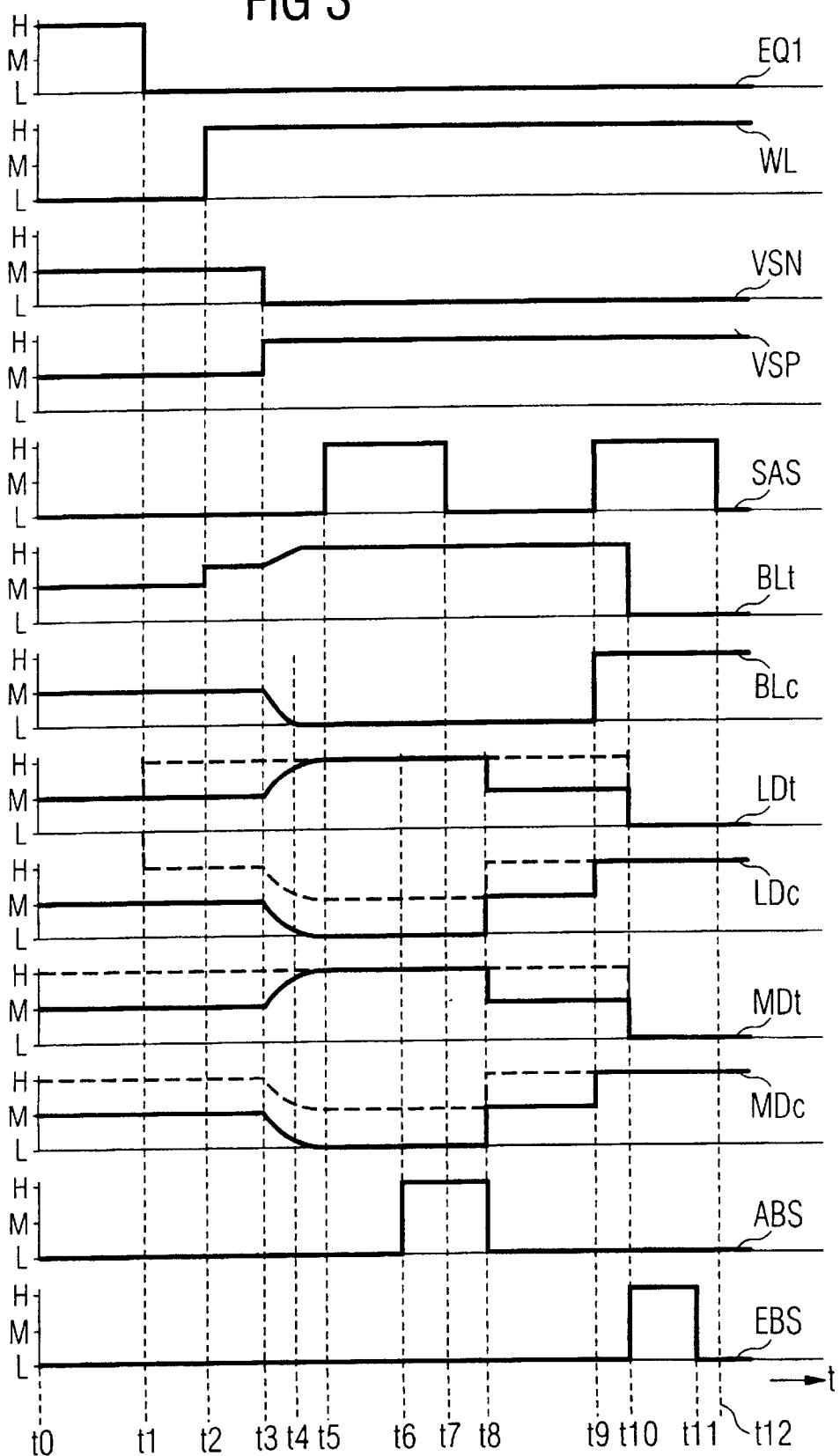

MEMORY CIRCUIT HAVING A PLURALITY OF MEMORY AREAS

BACKGROUND OF THE INVENTION

FIELD OF THE INVENTION

The invention concerns a memory circuit that includes at least two areas each having a plurality of memory cells. The invention is preferably but not exclusively used for DRAMs (Dynamic Random Access Memories).

In data memories the binary memory cells are often grouped into several separate areas, each having its own group of read amplifiers, each of which is responsible for a subset of the cells of the area concerned. Normally the cells of each memory area form a matrix of rows and columns, and each column is assigned a read amplifier. Each row can be selectively addressed by enabling an assigned word line. This enabling action causes each cell of the row concerned to pass their memory contents to the read amplifier assigned to their column, which subsequently generates an amplified signal representing the binary value of the saved item of data. By closing a transfer switch assigned to the read amplifier, this binary representation is then transferred to a local data line, which can be connected via a line switch to a master data line in order to transfer the binary representation to a secondary read amplifier where it is amplified in order to output the item of data.

Generally the local data lines and the master data line have two conductors. For this plurality each primary read amplifier has a symmetrical output configuration. If it has sensed the contents of a memory cell to be an item of data corresponding to the first binary value, one output connection of the amplifier goes to a first defined logic potential, and the other output connection goes to a second defined logic potential. If the item of data contained in the cell corresponds to the second binary value, then the two logic potentials at the output terminals of the amplifier appear inverted. By closing the transfer switch when the line switch is closed, the output potentials of the read amplifier are applied to the conductors of the local data line, and reach the conductors of the master data line via the line switch to set up a potential difference there representing the sensed item of data. The secondary read amplifier is therefore configured as a differential amplifier with symmetrical input. Conventionally, the supply potentials at the base side and load side of this amplifier lie symmetrically about the center of the two logic potentials, and close to one or the other logic potential respectively.

Before closing a line switch and before a transfer switch to any of the primary read amplifiers is closed, the conductors of the local data line concerned are equalized to a certain potential that normally lies in the center of the two logic potentials. Before closing a line switch, the conductors of the master data line are also equalized to a certain potential. It is conventional to choose one of the two logic potentials for this second equalization potential, and specifically a potential that is equal or nearly equal to the load-side supply potential of the secondary read amplifier. This amplifier then remains in the linear region of the amplifier characteristic when the input terminals are driven by the potential difference that is set up on the conductors of the master data line after closing the line switch and opening a transfer switch.

When the line switch is closed, which normally happens before the transfer switch is closed, both conductors of the local data line go initially to the equalization potential of the master data line. For this to happen the source of this equalization potential must supply current. If then, after isolating this potential source from the conductors of the master data line, the transfer switch is closed, the primary read amplifier must supply current to drag one of the conductors from both the local data line and the master data line away from the equalization potential.

SUMMARY OF THE INVENTION

It is accordingly an object of the invention to provide a memory circuit which overcomes the above-mentioned disadvantages of the heretofore-known memory circuits of this general type and which has a reduced current consumption.

With the foregoing and other objects in view there is provided, in accordance with the invention, a memory circuit, including:

at least two memory areas each including a plurality of cells for storing in each case an item of binary data;

a two-conductor local data line assigned to a corresponding one of the at least two memory areas, the two-conductor local data line including a first conductor and a second conductor;

selectively closable transfer switches;

each of the at least two memory areas including a plurality of primary read amplifiers each assigned to a respective subset of the cells in order to sense an item of binary data saved in an addressed one of the cells of the subset;

the primary read amplifiers setting, via respective ones of the selectively closable transfer switches, the first conductor of the two-conductor local data line to a first logic potential and the second conductor of the two-conductor local data line to a second logic potential, if the item of binary data having been sensed has a first binary value, and setting the first conductor to the second logic potential and the second conductor to the first logic potential, if the item of binary data having been sensed has a second binary value;

a selectively controllable line switch;

a secondary read amplifier configured as a differential amplifier and having input terminals;

a two-conductor master data line including two conductors respectively connected to the input terminals of the secondary read amplifier;

the first conductor and the second conductor of the two-conductor local data line being connected, via the selectively controllable line switch, to the conductors of the two-conductor master data line;

precharging devices for equalizing, prior to closing a respective one of the selectively closable transfer switches, the first conductor and the second conductor of the two-conductor local data line to a potential lying between the first logic potential and the second logic potential, and for equalizing, prior to closing the selectively controllable line switch, the two conductors of the master data line to a potential lying between the first logic potential and the second logic potential; and the secondary read amplifier having an amplifying operating range and being provided with supply potentials such that the secondary read amplifier operates within the amplifying operating range when either one of the input terminals of the secondary read amplifier is driven to the first logic potential and another one of the input terminals of the secondary read amplifier is driven to the second logic potential.

In other words, the invention is realized in a memory circuit having at least two areas, each of which contains a plurality of cells for storing in each case an item of binary data, and a plurality of primary read amplifiers, each of which is assigned to a subset of these cells in order to sense the item of data saved in one addressed member of the assigned cells, and, via a selectively closable transfer switch, to set the first conductor of a two-conductor local data line assigned to the corresponding memory area to a first logic potential, and the second conductor of this data line to a second logic potential, if the sensed item of data has the first binary value, and the first conductor to the second logic potential, and the second conductor to the first logic potential, if the sensed item of data has the second binary value, the conductors of each local data line being connected via an assigned, selectively controllable line switch to the conductors of a two-conductor master data line that is connected to the input terminals of a secondary read amplifier configured as a differential amplifier, and precharging devices being provided in order to equalize both conductors of the assigned local data line, prior to the closure of the transfer switch of a primary read amplifier, to a potential lying between the first and the second logic potential, and to equalize the potentials of both conductors of the master data line prior to the closure of a line switch. According to the invention the equalization potential for the master data line also lies between the first and the second logic potential, and the supply potentials of the secondary read amplifier are provided so that it remains within the amplifying operating range when either of its input terminals is being driven to the first logic potential and the other input terminal is being driven to the second logic potential respectively.

Due to to the invention the current consumption from the source of the equalization potential for the master data line and the current consumption via the primary read amplifier is less than in customary practice. The smaller the difference between the equalization potentials of the local and master data line, and the closer these equalization potentials lie to the center point between the two logic levels, the lower the current consumption; it is minimized when the equalization potential to which the master data line is precharged is equal to the value lying in the center of the two logic potentials, i.e. is an average value of the two logic potentials. A further advantage of the invention is that the second amplifier has a larger input control range and is therefore less sensitive to noise.

According to another feature of the invention, the precharging devices respectively provide a first equalization potential for the two-conductor master data line and a second equalization potential for the two-conductor local data line such that the first equalization potential is equal to the second equalization potential.

According to yet another feature of the invention, the precharging devices respectively provide an equalization potential for the two-conductor master data line and for the two-conductor local data line such that the equalization potential is equal to a center value between the first logic potential and the second logic potential.

According to a further feature of the invention, the secondary read amplifier is provided with the supply potentials such that the amplifying operating range of the secondary read amplifier lies symmetrically about the center value between the first logic potential and the second logic potential.

According to another feature of the invention, the secondary read amplifier is provided with a base-side supply potential and a load-side supply potential as the supply potentials such that the base-side supply potential lies further away from a center value between the first and second logic potentials than the load-side supply potential.

According to another feature of the invention, a bit line leads to an assigned one of the primary read amplifiers; the cells are memory cells each including a capacitor as a memory element and a field-effect transistor as a select switch; the field-effect transistor being controllable for selectively connecting the capacitor to the bit line; the secondary read amplifier being provided with a base-side supply potential as one of the supply potentials; and the field-effect transistor having a substrate provided with the base-side supply potential for minimizing leakage currents when the field-effect transistor is in a blocking state.

Other features which are considered as characteristic for the invention are set forth in the appended claims.

Although the invention is illustrated and described herein as embodied in a memory circuit having a plurality of memory areas, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a timing diagram for illustrating the temporal course of the electrical potentials at various points of the circuit components shown in FIG. 2.

DESCRIPTION OF THE PREFERRED EMBODIMENTS

The description below is based on the following convention: the two defined binary states of a memory cell are designated, as is general practice, by the logic symbols "0" and "1", as are the data values belonging to these states. The two logic potentials are labeled with H (for "high") and L (for "low"). H and L are defined limits or threshold values at either end of a potential range, whose center point is designated as the M level. If in the description it states that a circuit point goes to or lies at H or L level, then this means in general that the potential reaches "at least" the threshold value concerned. In the exemplary embodiment described, it is assumed that H is positive with respect to L. This assumption is not a necessary assumption however.

Figure 1:
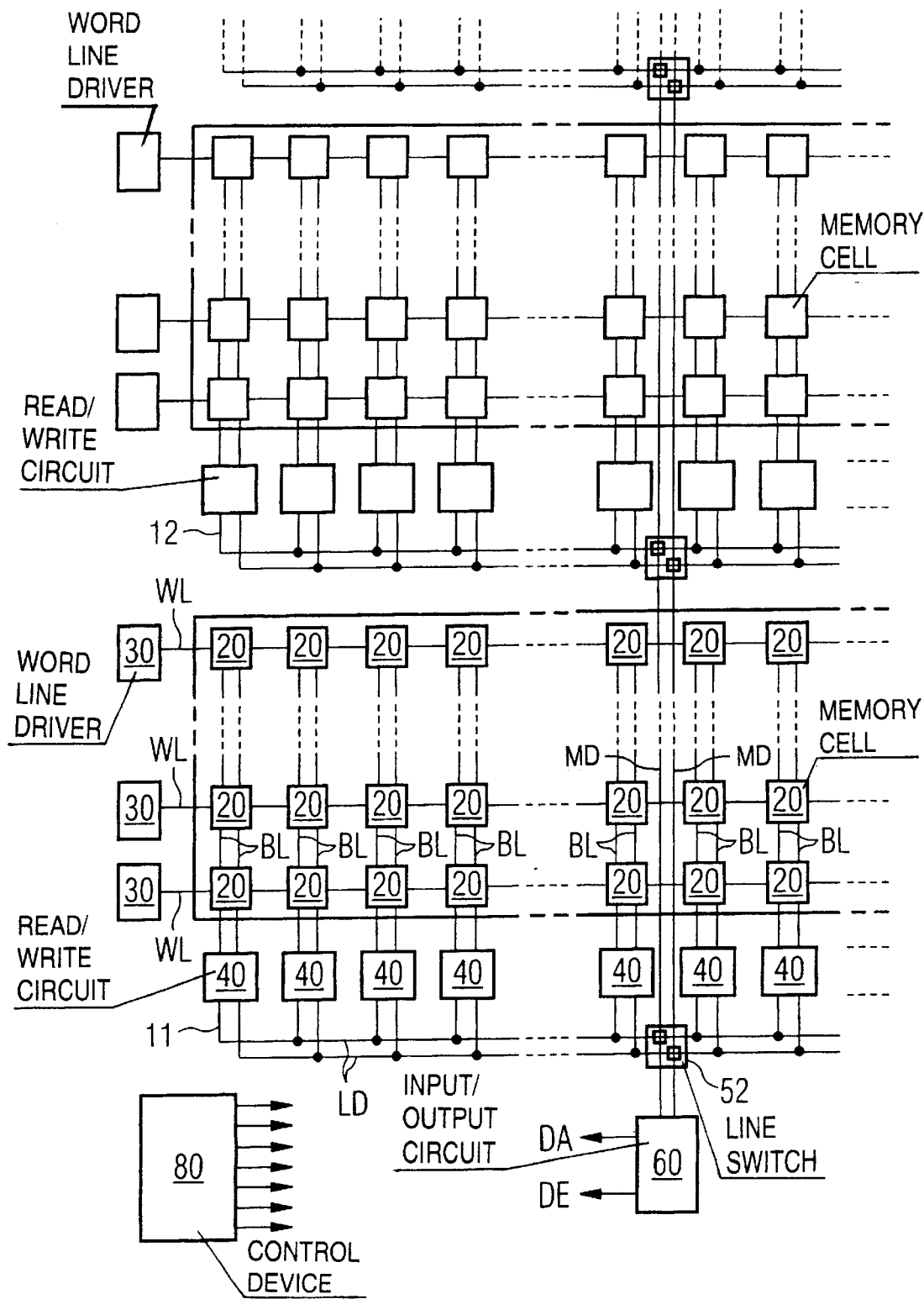
FIG. 1 is a fragmentary, schematic circuit diagram illustrating an exemplary layout for a plurality of memory areas and other components of a memory circuit according to the invention integrated on a chip.

The diagram of FIG. 1 shows sections of two memory areas 11 and 12 of a DRAM memory circuit. Each of these memory areas contains a number of memory cells provided in a matrix-like layout of rows and columns. An assigned word line WL runs along each row, and an assigned two-conductor bit line BL runs along each column. Near to each crossover point between a word line WL and a bit line BL there is a memory cell 20 that can be selectively accessed by enabling the word line concerned using an assigned word-line driver 30, and enabling a read/write circuit 40 connected to the corresponding bit line in order to read or write an item of binary data 0 or 1 from/to the cell, as is generally known.

The read/write circuits 40 of the memory area 11 are connected to a common two-conductor local data line LD assigned to this area, which itself can be connected to a two-conductor master data line MD via a two-terminal line switch 52. In the same way, the read/write circuits of the memory area 12 can also be connected to the master data line MD via a common local data line assigned to the area concerned and an assigned line switch. Normally a memory circuit contains more than two memory areas, e.g. eight, all configured and connected in a similar way to areas 11 and 12. The drawing would therefore continue upward accordingly. For reasons of space, however, the top of the figure only shows the local data line for a third memory area (not shown) and its connection to the master data line MD via an assigned line switch. For reasons of clarity the switching devices for precharging or equalizing the data line conductors are not included in FIG. 1.

The master data line MD is connected to an input/output circuit 60 that has a terminal DE for the input of an item of data to be written to a selected memory cell, and a terminal DA for the output of an item of data read from a selected memory cell. The selection of a memory cell thus includes the selection and enabling of a word line WL, the selection and enabling of the read/write circuit 40 accessing the memory cell, and the selection and closing of the line switch between the master data line MD and the local data line LD leading to the memory area concerned. The control signals needed to do this, and also the signals for precharging the data lines LD and MD, for controlling the read and write operation of the read/write circuits 40 and for controlling the input and output operation of the input/output circuit 60, are generated in the required time sequence by a control device 80. The control device 80 is integrated on the same chip as the elements already described, and also contains a device for decoding the address signals applied externally for selecting the memory cells.

Figure 2:
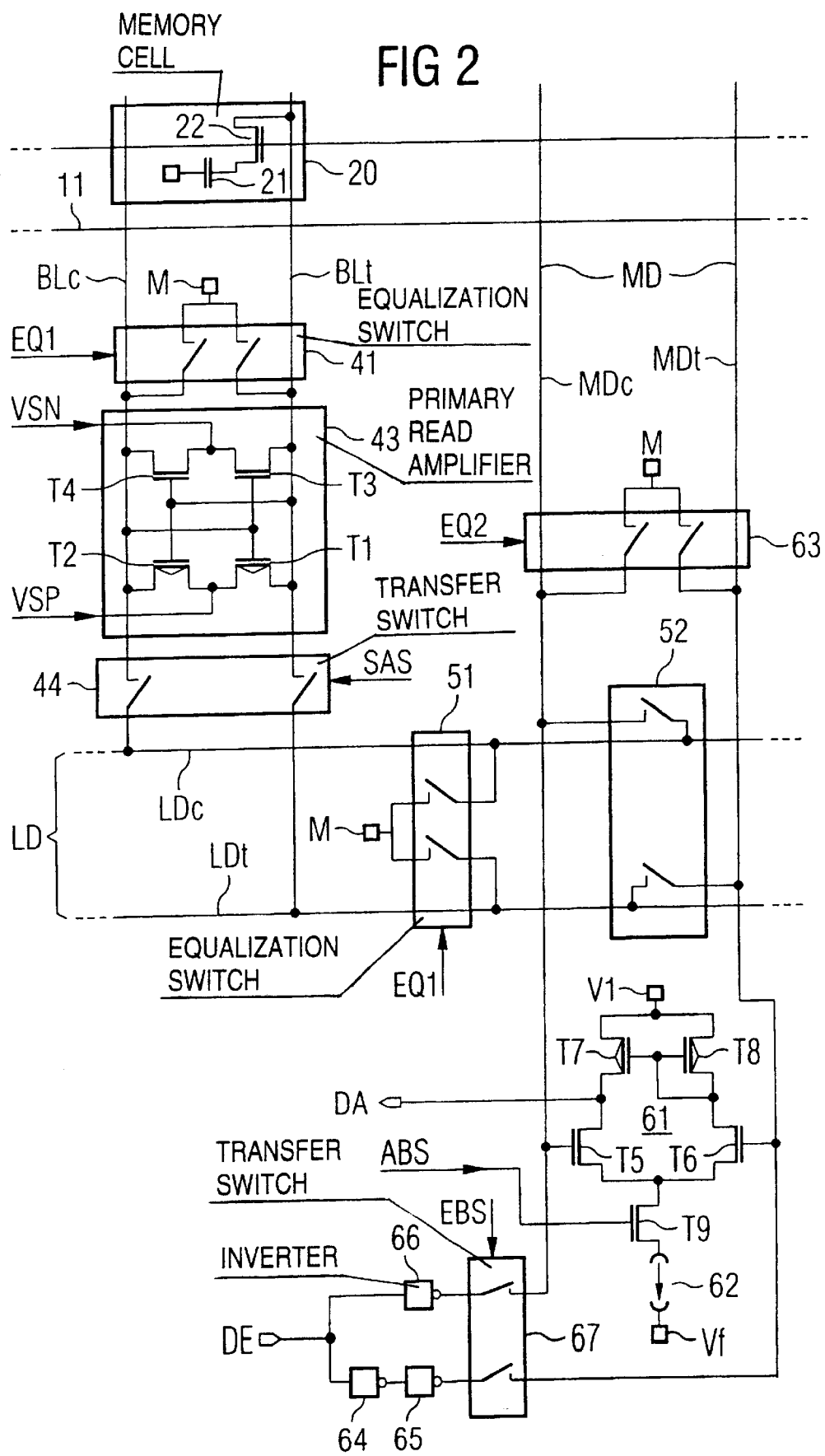
FIG. 2 is a detailed circuit diagram of a section of the layout of FIG. 1.

In the following description, the operations occurring during reading and writing on a selected memory cell are explained with reference to FIGS. 2 and 3. FIG. 2 shows in enlarged and detailed view a portion of FIG. 1, containing a memory cell 20 e.g. from the memory area 11, and the data transfer path between this memory cell and the input/output circuit 60; in addition it shows the switching elements for precharging or equalizing the data lines. FIG. 3 shows in a diagram with a common time axis the variation over time of the potentials at various points and at control terminals in this transfer path.

The memory cell 20 shown in FIG. 2 contains a capacitor 21 forming the actual memory element and whose state of charge represents the binary or data value "1" (charged) or "0" (uncharged). One side of the memory capacitor 21 lies at a fixed potential, and the other side is connected to one of the two conductors of the assigned two-conductor bit line via the channel of an N-FET select transistor 22. The gate of the select transistor 22 lies on the associated word line WL. Following the common form of usage, one of the conductors is designated the "true" bit-line conductor BLt and the other the "complement" bit-line conductor BLc. In the case shown, the select transistor 22 is connected to the true bit-line conductor BLt, as are the select transistors for all the other cells with the same word line WL. The way in which the select transistors are connected switches from word line to word line between true and complement bit-line conductors.

The read/write circuit 40 (FIG. 1) connected to the bit-line conductors BLt and BLc contains a primary read amplifier 43 having symmetrical input and symmetrical output, as shown in FIG. 2. The read amplifier 43 contains a first transistor pair formed of two p-channel field effect transistors (P-FETs) T1 and T2, and a second transistor pair formed of two n-channel field effect transistors (N-FETs) T3 and T4. The source electrodes of the P-FETs T1 and T2 are connected together at a circuit point to which a first bias voltage signal VSP can be applied. The source electrodes of the N-FETs T3 and T4 are connected together at a circuit point to which a second bias voltage signal VSN can be applied. The drain electrodes of the transistors T1 and T3, and the gate electrodes of the transistors T2 and T4 are connected to the bitline conductor BLt and can also be connected to the local data line conductor LDt via a first branch of a two-terminal transfer switch 44. In a similar way, the drain electrodes of transistors T2 and T4, and the gate electrodes of transistors T1 and T3, are connected to the bit-line conductor BLc and can also be connected to the local data line conductor LDc via the second branch of the transfer switch 44.

In the quiescent state of the memory circuit (time t0 in FIG. 3), before initiating a cell access operation, all word lines are held at L level so that the select transistors of all cells are cut off (blocking state), and the bitline conductors BLt and BLc are held at a common precharging or "equalization" potential M that lies as accurately as possible between the L and H level. The latter is achieved through the use of an equalization switch 41, represented symbolically as a two-terminal mechanical switch, and which is closed by an equalization signal EQ1 from the control device 80 (FIG. 1) so as to connect both bitline conductors BLt and BLc to a source of the M potential. A similar equalization switch 51, controlled in the same way by the equalization signal EQ1, is located on the LDt and LDc conductors of the local data line LD, in order to equalize these conductors to M potential as well. An equalization switch 63 is also provided on the master data line MD, which in the quiescent state is also held closed by a control signal EQ2 in order to keep the conductors MDt and MDc to M potential. The line switch 52 is held open in the quiescent state so that the local data line LD is isolated from the master data line MD.

While in the quiescent state, the signals VSN and VSP are held at M level so that the read amplifier 43 is in the floating state. In addition the transfer switch 44 is open in the quiescent state so that the read amplifier 43 is isolated from the local data line LD.

In order to initiate a cell access, at time t1 the signal EQ1 is initially disabled in order to open the equalization switches 41 and 51 and hence isolate the bitline conductors BLt and BLc and the conductors LDt and LDc of the local data line LD from the M potential. The line switch 52 is closed in order to connect the local data line LD to the master data line MD. Shortly afterward, at time t2, the word line WL is enabled, i.e. switched to H level, so that the select transistor 22 is conducting. If the cell 20 is charged, i.e. storing the binary value "1", there is a small rise in potential above the M level on the bitline conductor BLt, so that BLt is positive with respect to BLc. This situation is shown in FIG. 3. If, on the other hand, the cell 20 is uncharged, i.e. storing the value "0", there is a small drop in potential below the M level on the bitline conductor BLt, so that BLt is negative with respect to BLc.

A short time later, at time t3, the signal VSN is switched to L level and the signal VSP to H level. This enables the read amplifier 43, in that it now receives its full supply voltage and operating current from the sources of the two signals. If the potential on BLt has risen, as shown in FIG. 3, then the transistors T1 and T4 are driven toward increasing conductivity, and the transistors T2 and T3 toward increasing cut-off, so that BLt is pulled toward the H level of VSP and the other bitline conductor BLc toward the L potential of VSN. As a result of the positive feedback between T1 and T4 and between T2 and T3, and the negative feedback between T1 and T2 and between T3 and T4, this process is speeded up and causes the end state to latch. If, on the other hand, BLt became negative with respect to BLc at the instant when the read amplifier is enabled, then the opposite end state occurs, in which BLt is pulled to L level and BLc to H level. The "pulled apart" potential difference of either end state between the bitline conductors BLt and BLc is fed back to the memory cell, thereby refreshing the data in the memory cell. This process is complete at time t4 and the read amplifier 43 fully enabled.

The control sequence described so far runs simultaneously in all the read/write circuits 40 of the memory area 11 concerned, so that the read amplifiers assigned to the other columns (not shown in FIG. 2) are also enabled at time t4. A selected member of the read amplifiers can now be connected via the local data line LD and the master data line MD to the input/output circuit 60 for a read or a write operation. To do this the assigned transfer switch 44 is closed at time t5 by a column selection signal SAS. At this point in time, at the latest, the equalization switch 63 of the master data line MD is opened, so that the conductors MDt and MDc are isolated from the source of the M potential.

With the closure of the transfer switch 44 at the output of the primary read amplifier 43 at time t5, the potential difference, "pulled apart" in the way described, appearing across the bitline conductors BLt, BLc, is coupled onto the local data line conductors LDt, LDc, which in the quiescent state were set at the M potential by the equalization switch 51, and which still have this potential even after opening this switch (time t1). In the example illustrated in FIG. 3 (reading a "1"), at time t5 the local data line conductor LDt jumps from the M level to H level, and LDc jumps from the M level to L level. In order to output the item of data at the data output DA, the input/output circuit 60 must be driven by the local data line via the master data line MD. For a write operation, the potential difference corresponding to the data to be written can be coupled from the local data line conductors onto the bitline conductors. If this item of data is the same as the previous item of data held in the memory, then there is no change in the control state of the read amplifier 43. If, however, the new item of data is the opposite binary value (reversed potential difference) then the read amplifier 43 must be pushed into the other control state. But first of all the remaining sequence for the read operation will be described.

The input/output circuit 60 contains a secondary read amplifier 61 that normally has a differential amplifier configuration and can be enabled by an output command signal ABS. In the illustrated example situation, the read amplifier 61 is an FET differential amplifier with active load and containing a current mirror for forming an asymmetric output. Two N-FETs T5 and T6 are used as input transistors, their source electrodes being connected together to form the base point of the amplifier and also being connected via the channel of an N-FET T9 and a current-source circuit 62 to a "base-side" supply potential Vf. The gate of T5 is connected to the data line conductor MDc, and the gate of T6 is connected to the data line conductor MDt. The drain of each of the input transistors T5 and T6 is connected via the channel of an associated P-FET T7 and T8 respectively to a "load-side" supply potential V1, which is positive with respect to Vf. The data output DA is located at the drain of T7. The gates of the P-FETs T7 and T8 are connected together. The drain and gate of the P-FET T8 are connected together.

The two input terminals of the amplifier 61 are connected to the two conductors MDt and MDc of the master data line MD in order to amplify the potential difference appearing there. When the read amplifier 61 is in the enabled state, an H level should appear at the data output if the item of data read from the memory cell 20 is a "1"; the data output DA should go to L level, however, if the item of data read from the memory cell is a "0".

In digital circuits the threshold values for the two logic levels L and H are normally selected so that they both lie between the supply potentials provided for supplying the amplifiers (and other processing elements) used. Usually the ground potential is selected as the base-side supply potential of differential amplifiers. In secondary read amplifiers for memory circuits, the operating range of the amplifier is normally used in such a way that the differential signal on the input side is centered on a value close to the load-side supply potential, i.e. when the differential signal is zero, the potential at both input terminals lies as close as possible to the load-side supply potential. Consequently, in a system according to the prior art, the conductors MDt and MDc of the master data line MD were precharged before a read operation to the logic potential concerned, so in this case to the H potential. The resulting operation according to the prior art is explained below with reference to the circuit example shown in FIG. 2 of the secondary read amplifier 61. The resultant variation over time of the potentials on the master data line conductors MDt and MDc and on the local data line conductors LDt and LDc are shown dashed in FIG. 3 for this case.

Before enabling the amplifier 61, the signal ABS applied to the gate of the N-FET T9 is at L level, so that T9 is cut off. Thus there is no connection between the base-side supply potential Vf and the input transistors T5 and T6.

When the line switch 52 is closed, e.g. at time t1 before the transfer switch 44 is opened, LDt and LDc go to the equalization potential of the master data line MD. If, according to the prior art, this potential is the H level, then LDt and LDc are also pulled to H level as shown dashed in FIG. 3. If then after opening the equalization switch 63, the transfer switch 44 at the output of the primary read amplifier 43 is closed at time t5 in order to transfer the data value "1" indicated by the conductors LDt and LDc of the local data line onto the master data line MD, the conductors MDt and LDt remain at the H level, while the potential of the conductors MDc and LDc is reduced from the H level to reach at time t6, after a certain delay (caused by an unavoidable RC time constant), a value at which the secondary read amplifier 61 reliably senses the potential difference. This is also shown dashed in FIG. 3. The gate of the input transistor T5 of the secondary read amplifier 61 lies at the reduced level, while the gate of the input transistor T6 continues to lie at the H level. The situation is reversed if a "0" data value is indicated on the local data line.

At time t6 the secondary read amplifier 61 is enabled by taking the output command signal ABS to H level, so that T9 is conducting, and the source electrodes, which are connected together, of the input transistors T5 and T6 receive current via the current source 62. When the gate potential at the input transistor T5 falls with respect to the H level (reading a "1"), T5 is increasingly cut off, so that the data output DA goes to H level. When the gate potential at the input transistor T6 falls (reading a "0"), T6 is increasingly cut off, so that DA goes to L level. The column selection signal SAS can be switched back to disabled at time t7 shortly after t6.

The common practice up to now of equalizing the conductors MDt and MDc of the master data line MD to the H potential prior to enabling the read amplifier 61 has disadvantages however. Significant current consumption results from the two conductors LDt and LDc of the local data line LD being pulled to H level when the line switch 52 is closed (time t1). This is a waste in practice, because later, when closing the transfer switch 44 (time t5), one conductor of both the local data line LD and the master data line MD must be pulled down to the L level via the primary read amplifier 43 owing to the read result (e.g. the conductors LDc and MDc in the case of reading a "1"), which means that the primary read amplifier 43 must supply extra current. This amplifier must therefore be configured to be suitably powerful. A further disadvantage lies in the fact that the control range of the differential signal at the input to the secondary read amplifier 61 is equal to just |(H−L)/2| maximum.

In order to avoid these disadvantages, this invention deviates from the formerly established practice by holding the two conductors MDt and MDc not at the H potential, but at a value between the H and L potential, preferably the M potential, before closing the line switch 52. This is achieved by the control signal EQ2 from the control device 80 (FIG. 1) keeping the equalization switch 63 closed, so that the two master data line conductors MDt and MDc are connected to the source of the M potential. When the line switch 52 is closed, the signal EQ2 is disabled in order to open the equalization switch 63, so that the master data line conductors MDt and MDc, together with the local data line conductors LDt and LDc, can be pulled to the potentials of the bitline conductors BLt and BLc. In the case of reading a "1", LDt and MDt are pulled from the previous M level toward the H level, and LDc and MDc are pulled from the previous M level toward the L level, as shown by the continuous lines in FIG. 3. In the case of reading a "0", LDt and MDt go from M to L level, and LDc and MDc from M to H level. The primary read amplifier 43 therefore needs to supply at each of its output lines no more current than is required by a change in level of magnitude |(H−L)/2| on the assigned data line conductors.

The precharging of the master data line MD to M level also has consequences for the operation of the secondary read amplifier 61. Now the potential difference at the input terminals to the amplifier 61 has a value of zero if both the terminals are at M potential (instead of H potential as previously), i.e. at a potential that is more negative than in the prior art by the magnitude |H−M|. In this case the operating range of the amplifier can only be optimally utilized when the lower supply potential Vf is also shifted by a certain amount in the negative direction. This amount is chosen so that the amplifier remains within the amplifying operating range when either of its input terminals goes to the H potential while the other input terminal goes to the other L potential respectively.

Setting the precharging potential of the master data line MD to the center level M, as given in the invention, has further advantages. The magnitude of the potential difference between the master data line conductors MDt and MDc, and thus at the input terminals of the amplifier 61, changes after closing the line switch 52 from zero to maximum |H−L|, i.e. the control range at the amplifier input is twice as large as in the prior art. This results in an improvement in the noise margin (ratio of the wanted signal to the noise signal), and a faster rise in the absolute value of the differential signal at the amplifier input. As a result it is possible to reach the H or L level at the amplifier output DA more quickly without increasing the gain, so that the overall read operation can be shortened while maintaining the same noise immunity.

For the sake of completeness the write operation will also be described in brief using the example situation of writing a "0" to the same memory cell 20 following the read operation described above. The "0" is applied as an L level to the data input DE and appears as a conditioned L level at the output of two series-connected inverters 64 and 65, and as an H level at the output of an inverter 66.

The previous read operation is terminated by changing the output command signal ABS to L level at time t8. Simultaneously (or immediately afterward) the equalization switch 63 for the master data line is closed temporarily so that MDt and MDc go to the M level. After a certain stabilization time the equalization switch is opened again, and at time t9 the column selection signal SAS is re-enabled to H level, so that the transfer switch 44 closes again and LDc and MDc go to H level (because of the previously saved "1"). Then, at time t10, a two-terminal transfer switch 67 is closed through the use of an input command signal EBS, so that it transfers the "0" item of write data to the master data line MD by applying the L level from the output of the inverter 65 to the conductor MDt, and the H level from the output of the inverter 66 to the conductor MDc. As a result, LDt jumps to L level, while LDc remains at H level. This drives, via the closed transfer switch 44, the bit-line conductor BLt to L and the bit-line conductor BLc to H, so that the latch state of the primary read amplifier 41 switches over and the L potential is applied to the drain of the select transistor 22, which means that the binary "0" value is saved in the memory cell 20.

After this write operation, at time t11, the input command signal EBS is initially disabled, and then at time t12 the column select signal SAS is also disabled again. Then the same cycle from t5 to t12 can be run through again for reading and writing to another memory cell in the same row, the column select signal SAS now being applied to the different column in question. Once the write and/or read operations on the selected row are complete, the quiescent state applying at time t0 is restored by disabling the word line WL concerned, taking the signals VSN and VSP to M potential, closing the equalization switches 41, 51 and 63, and opening the line switch 52.

The invention is obviously not limited to the exemplary embodiment described with reference to FIGS. 2 and 3. The primary read amplifier 43 and in particular the secondary read amplifier 61 can also have a different configuration than that shown in FIG. 2. Any differential amplifier circuit can be used in principle as the secondary read amplifier. Thus, for instance, a differential amplifier with symmetrical output can also be used, and instead of an active load circuit a passive load circuit containing resistors can be used.

Nor is the invention restricted to the relative polarities of the potentials described, or to the conductance types of the transistors described. In the case shown in FIG. 2, the secondary read amplifier 61 is polarized in such a way (N-FETs as input transistors and P-FETs as load transistors) that the base-side supply potential Vf is the more negative potential. obviously the amplifier can also have the opposite polarity, so that Vf is positive with respect to V1, the input transistors being P-FETs and the load transistors N-FETs. The above equations apply generally even to this case, and to cases in which the relative polarities of L and H are swapped over. Finally it must be mentioned that the described advantages of the invention are also achieved to a certain degree if the M potential does not lie exactly in the center of L and H.

In the majority of typical integrated memory chips supply sources are provided that supply a plurality of different stabilized potentials for operating the memory chip, including potentials for supplying power to the various logic and amplifier circuits. In the invention one of these potentials can be used as supply potential V1 for the load-side of the secondary read amplifier. Either a separate supply source must be used to provide the base-side supply, or it can be obtained from a source amongst the various other sources available whose potential lies as close as possible to the ideal value. The source supplying the disabling potential for the word lines WL would be suitable for instance, or the source supplying the substrate potential "Vbb" for the select transistors 22 in the memory cells 20. Vbb is normally held further away from the center potential (H–L)/2 than the source potential, typically by 0.5 volts in order to minimize the leakage currents through the cut-off select transistor. In the case of memory cells using N-FETs (as shown in FIG. 2), Vbb is thus equal to −0.5 volts if L is set at 0 volts. This value is well-suited to the base-side supply potential Vf of the secondary read amplifier 61, so that it does not require any additional supply source for Vf. In particular, if H has the typical value of +1.8 volts, and also V1 lies near to this value as is usual, then the specified requirement is sufficiently fulfilled if Vf=Vbb=−0.5 volts.

We claim:

1. A memory circuit, comprising:
   at least two memory areas each including a plurality of cells for storing in each case an item of binary data;
   a two-conductor local data line assigned to a corresponding one of said at least two memory areas, said two-conductor local data line including a first conductor and a second conductor;
   selectively closable transfer switches;
   each of said at least two memory areas including a plurality of primary read amplifiers each assigned to a respective subset of said cells in order to sense an item of binary data saved in an addressed one of said cells of said subset;
   said primary read amplifiers setting, via respective ones of said selectively closable transfer switches, said first conductor of said two-conductor local data line to a first logic potential and said second conductor of said two-conductor local data line to a second logic potential, if the item of binary data having been sensed has a first binary value, and setting said first conductor to the second logic potential and said second conductor to the first logic potential, if the item of binary data having been sensed has a second binary value;
   a selectively controllable line switch;
   a secondary read amplifier configured as a differential amplifier and having input terminals;
   a two-conductor master data line including two conductors respectively connected to said input terminals of said secondary read amplifier;
   said first conductor and said second conductor of said two-conductor local data line being connected, via said selectively controllable line switch, to said conductors of said two-conductor master data line;
   precharging devices for equalizing, prior to closing a respective one of said selectively closable transfer switches, said first conductor and said second conductor of said two-conductor local data line to a potential lying between the first logic potential and the second logic potential, and for equalizing, prior to closing said selectively controllable line switch, said two conductors of said master data line to a potential lying between the first logic potential and the second logic potential; and
   said secondary read amplifier having an amplifying operating range and being provided with supply potentials such that said secondary read amplifier operates within the amplifying operating range when either one of said input terminals of said secondary read amplifier is driven to the first logic potential and another one of said input terminals of said secondary read amplifier is driven to the second logic potential.

2. The memory circuit according to claim 1, wherein said precharging devices respectively provide a first equalization potential for said two-conductor master data line and a second equalization potential for said two-conductor local data line such that the first equalization potential is equal to the second equalization potential.

3. The memory circuit according to claim 1, wherein said precharging devices respectively provide an equalization potential for said two-conductor master data line and for said two-conductor local data line such that the equalization potential is equal to a center value between the first logic potential and the second logic potential.

4. The memory circuit according to claim 3, wherein said secondary read amplifier is provided with the supply potentials such that the amplifying operating range of said secondary read amplifier lies symmetrically about the center value between the first logic potential and the second logic potential.

5. The memory circuit according to claim 1, wherein said secondary read amplifier is provided with a base-side supply potential and a load-side supply potential as the supply potentials such that the base-side supply potential lies further away from a center value between the first and second logic potentials than the load-side supply potential.

6. The memory circuit according to claim 1, including:
   a bit line leading to an assigned one of said primary read amplifiers;
   said cells are memory cells each including a capacitor as a memory element and a field-effect transistor as a select switch;
   said field-effect transistor being controllable for selectively connecting said capacitor to said bit line;
   said secondary read amplifier being provided with a base-side supply potential as one of the supply potentials; and
   said field-effect transistor having a substrate provided with the base-side supply potential for minimizing leakage currents when said field-effect transistor is in a blocking state.

* * * * *